(12) United States Patent
Pang

(10) Patent No.: US 11,764,767 B1
(45) Date of Patent: Sep. 19, 2023

(54) OPERATING MODE TRANSITION OPTIONS FOR BOOST CONVERTER

(71) Applicant: TEXAS INSTRUMENTS INCORPORATED, Dallas, TX (US)

(72) Inventor: Chuansong Pang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/145,525

(22) Filed: Dec. 22, 2022

(51) Int. Cl.
*H03K 4/08* (2006.01)

(52) U.S. Cl.
CPC .................................... *H03K 4/08* (2013.01)

(58) Field of Classification Search
CPC ............ H03K 4/06; H03K 4/063; H03K 4/08; H03K 4/48
USPC ....... 327/131, 132, 134, 135, 137, 139, 140, 327/306
See application file for complete search history.

(56) References Cited

U.S. PATENT DOCUMENTS

| 5,646,513 | A  | * | 7/1997  | Riggio, Jr. | ............ | H02M 3/156 |
|           |    |   |         |             |              | 323/285 |
| 10,756,627 | B2 | * | 8/2020  | Hsu         | ........      | H02M 3/158 |
| 2010/0156368 | A1 | * | 6/2010  | Huynh       | .....         | H02M 3/07 |
|           |    |   |         |             |              | 307/43 |
| 2011/0221412 | A1 | * | 9/2011  | Li          | ........      | H05B 45/38 |
|           |    |   |         |             |              | 323/283 |
| 2015/0381039 | A1 | * | 12/2015 | Hari        | ........      | H02M 1/15 |
|           |    |   |         |             |              | 323/271 |
| 2020/0266702 | A1 | * | 8/2020  | Zhao        | ........      | H02M 3/1582 |

* cited by examiner

*Primary Examiner* — William Hernandez
(74) *Attorney, Agent, or Firm* — Charles F. Koch; Frank D. Cimino

(57) ABSTRACT

A controller includes a ramp circuit and control logic. The ramp circuit includes: ramp generation circuitry having a first control input and a first current output; ramp adjustment circuitry having a second control input and a second current output; current scaling circuitry having a first current input, a current sense output and an offset current output, the first current input coupled to the first and second current outputs; and ramp completion circuitry having a current sense input and a completion output, the current sense input coupled to the current sense output. The control logic has a third control input and first and second control outputs. The third control input is coupled to the completion output. The first control output is coupled to the first control input. The second control output is coupled to the second control input.

21 Claims, 11 Drawing Sheets

OPERATING MODE TRANSITION OPTIONS FOR BOOST CONVERTER

BACKGROUND

Boost converters supply a higher output voltage ($V_{OUT}$) to a load based on a lower input voltage (VIN). An example system may include: a power supply to provide VIN; the boost converter; an output capacitor ($C_{OUT}$); and a load. In many systems, the power consumption of the load may vary over time. Properly managing reverse current (current flow from an output node to an input node of the boost converter) and operating mode transitions (e.g., transitioning between power off/on of the system or transitioning between varying load states) is an ongoing challenge for boost converter applications.

In a conventional approach, $C_{OUT}$ may be charged by an additional backup battery before being regulated by the boost converter. To avoid reverse current at startup (and related reduced life of the backup battery), a forced discontinuous conduction mode (DCM), also referred to as Pulse Frequency Modulation (PFM) in this context, may be used. After startup, a continuous conduction mode (CCM) may be preferred (e.g., to mitigate electromagnetic interference (EMI) issues). In a conventional approach, a dual loop control scheme uses a voltage loop to regulate $V_{OUT}$ and a current loop to control inductor current. In addition to the current loop, a valley current sense may be used to control inductor current. To support reverse current (which may be desirable for some applications), the sensed current ($I_{SNS}$) of the boost converter may be modified using an offset current ($I_{OFFSET}$). A conventional boost converter controller may apply $I_{OFFSET}$ for CCM operations even during a soft start interval. However, $I_{OFFSET}$ reduces $I_{SNS}$ as shown in Equation 1 and thus affects the valley control operations of the boost converter controller.

$$I_{SNS} = K_{SNS}\left(I_{REF} - \frac{R}{I_{REF}}I_{OFFSET}\right) \quad \text{Equation (1)}$$

The result of applying $I_{OFFSET}$ is that the average inductor current of the boost converter decreases due to $I_{SNS}$ being lower. If $I_{OFFSET}$ is increased suddenly, $I_{SNS}$ decreases suddenly and $V_{OUT}$ will drop even if the load has not changed. This is due to less power being transferred in the following several cycles. Eventually, the voltage loop will regulate $V_{OUT}$ with a higher reference current ($I_{REF}$). Such drops in $V_{OUT}$ produce a less monotonous output waveform that is not desirable.

There are two conventional solutions to reduce $V_{OUT}$ drops. A first solution splits $I_{OFFSET}$ into smaller parts and injects each part in respective time intervals. With the first solution, $V_{OUT}$ drops are smaller, but the $V_{OUT}$ waveform is not smooth and has multiple smaller drops. A second first solution uses load transient enhancement functions in the boost converter control loop to reduce $V_{OUT}$ drops. However, load transient enhancement functions are limited and may not result in target $V_{OUT}$ stability for a system.

SUMMARY

In an example embodiment, a controller comprises a ramp circuit and control logic. The ramp circuit includes: ramp generation circuitry having a first control input and a first current output; ramp adjustment circuitry having a second control input and a second current output; current scaling circuitry having a first current input, a current sense output and an offset current output, the first current input coupled to the first and second current outputs; and ramp completion circuitry having a current sense input and a completion output, the current sense input coupled to the current sense output. The control logic has a third control input and first and second control outputs. The third control input is coupled to the completion output. The first control output is coupled to the first control input. The second control output is coupled to the second control input.

A system comprises a power stage having a power input, a first ground terminal, first and second control inputs, and a power output. The system also comprises a controller having a sense input, a second ground terminal and first and second control outputs. The sense input is coupled to the power output. The first control output is coupled to the first control input. The second control output is coupled to the second control input. The controller includes a ramp circuit and control logic. The ramp circuit includes: ramp generation circuitry having a third control input and a first current output; ramp adjustment circuitry having a fourth control input and a second current output; current scaling circuitry having a first current input, a current sense output and an offset current output, the first current input coupled to the first and second current outputs; and ramp completion circuitry having a current sense input and a completion output, the current sense input coupled to the current sense output. The control logic has a fifth control input and third and fourth control outputs. The fifth control input is coupled to the completion output. The third control output is coupled to the third control input. The fourth control output is coupled to the fourth control input.

DETAILED DESCRIPTION

Figure 1:
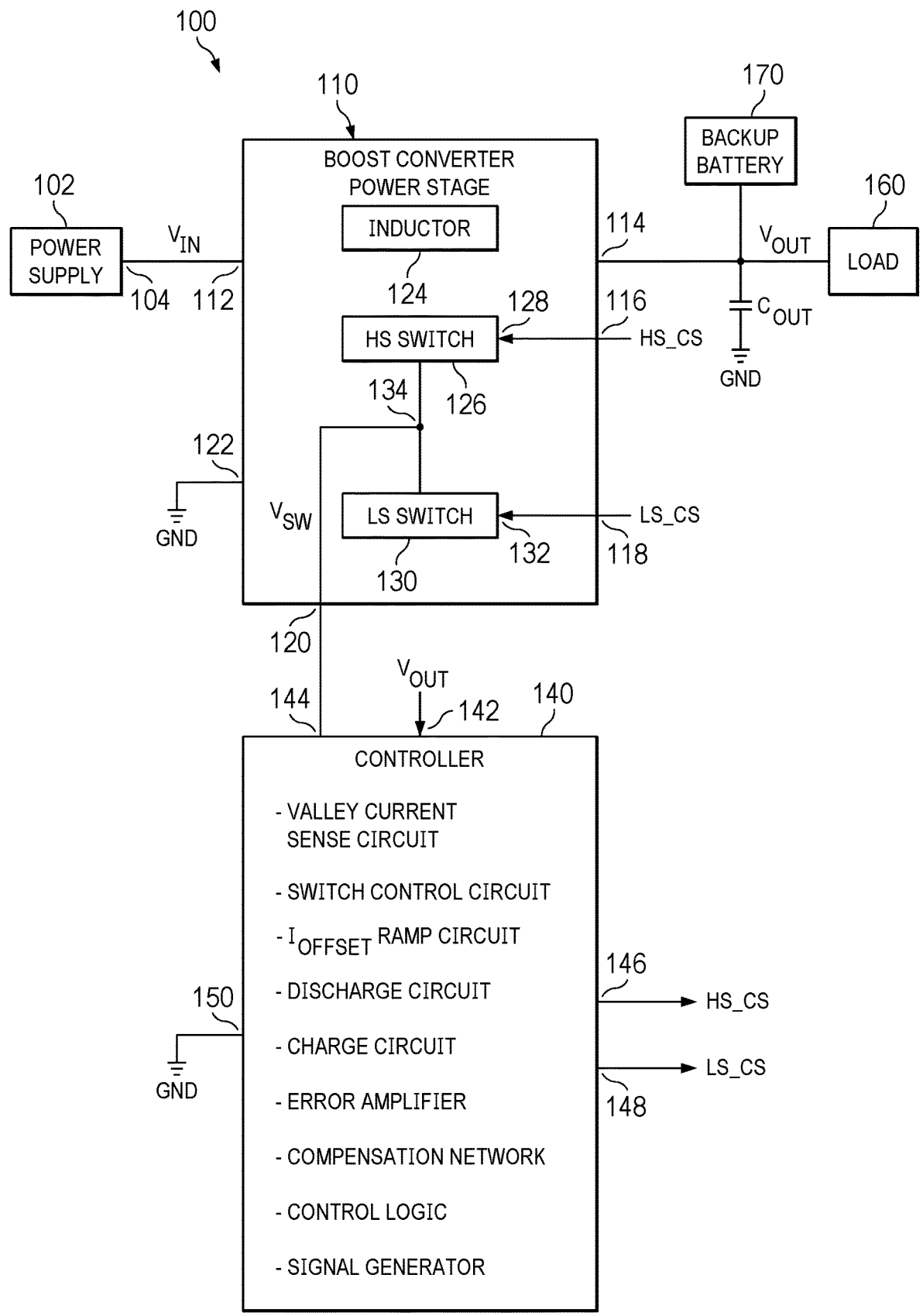
FIG. 1 is a block diagram showing a system in accordance with an example embodiment.

The same reference numbers or other reference designators are used in the drawings to designate the same or similar (either by function and/or structure) features.

FIG. 1 is a block diagram showing a system 100 in accordance with an example embodiment. As shown, the system 100 includes a power supply 102, a boost converter power stage 110, a controller 140 for boost converter power stage 110, a load 160, and an output capacitor ($C_{OUT}$) in the arrangement shown. In some example embodiments, the system 100 may include additional components such as: a backup battery 170 coupled to $C_{OUT}$ and the load 160; and/or an input capacitor ($C_{IN}$) between the power supply 102 and the boost converter power stage 110. With the backup battery 170, $C_{OUT}$ may maintain an output voltage ($V_{OUT}$) for the load 160 even if the boost converter power stage 110 is off or otherwise unable to maintain $V_{OUT}$ at a target level.

In the example of FIG. 1, the power supply 102 has a power supply output 104. The boost converter power stage 110 has a power input 112, a power output 114, a first control input 116, a second control input 118, a sense output 120 and a ground terminal 122. The boost converter includes an inductor 124, a high-side (HS) switch 126 and a low-side (LS) switch 130. In the example of FIG. 1, the HS switch 126 includes a control terminal 128 coupled to the first control input 116, and the LS switch 130 includes a control terminal 132 coupled to the second control input 118. Between the HS switch 126 and the LS switch 130 is a switch node 134 coupled to the sense output 120. During operations of the boost converter power stage 110, the sense output 120 provides a switch node voltage ($V_{SW}$) at switch node 134.

In different example embodiments, the topology (e.g., the arrangement of the inductor 124, the HS switch 126, and the LS switch 130) of the boost converter power stage 110 may vary. Regardless of topology, the boost converter power stage 110 is configured to regulate power to the load 160 based on the input voltage (VIN) provided by the power supply 102, a target $V_{OUT}$ (not shown), and the operations of the controller 140. In order to improve efficiency of the boost converter power stage 110, the controller 140 is configured to support different modes of operations. Example modes of operation supported by the controller 140 include a discontinuous conduction mode (DCM) and a forced continuous conduction mode (FCCM). For the different modes of operation, the minimum current in the inductor 124 is limited. With a non-zero average current in the inductor 124, $V_{OUT}$ rises if the load consumes less energy than what is provided by the average inductor current. If the controller 140 is paused to avoid $V_{OUT}$ rising further, the inductor current may drop to zero, resulting in a DCM scenario. If the load is heavy enough, the inductor current will not reach the minimum limit. To avoid a zero inductor current condition and DCM, FCCM may be used. With FCCM, the minimum current limitation is decreased so that controller 140 can regulate $V_{OUT}$ based on a zero average current rather than no switching.

In some scenarios, FCCM is preferred over DCM to improve electromagnetic interference (EMI) or related switch noise issues. However, FCCM does result in a reverse current at times in the inductor 124, which may be accounted for by the control system. For each of the operational modes, the HS switch 126 is controlled by a high-side control signal (HS_CS) provided by the controller 140, while the LS switch 130 is controlled by a low-side control signal (LS_CS) provided by the controller 140.

In some example embodiments, the controller 140 has a first sense input 142, a second sense input 144, a first control output 146, a second control output 148, and a ground terminal 150. The first sense input 142 is coupled to the power output 114 of the boost converter power stage 110 and receives $V_{OUT}$. The second sense input 144 is coupled to the sense output 120 of the boost converter power stage 110 and receives $V_{SW}$. The first control output 146 provides HS_CS responsive to operations of the controller 140 and is coupled to the first control input 116 of the boost converter power stage 110. The second control output 148 provides LS_CS responsive to operations of the controller 140 and is coupled to the second control input 118 of the boost converter power stage 110.

In operation, the controller 140 is configured to adjust the parameters (e.g., the on-time, the off-time, a turn on trigger, a turn off trigger, the frequency, etc.) of HS_CS at the first controller output 146 and of LS_CS at the second controller output 148 based on various control options and related circuits. In some example embodiments, the controller 140 controls HS_CS_ and LS_CS using a valley current sense circuit, a switch control circuit, an offset current ($I_{OFFSET}$) ramp circuit, a discharge circuit, a charge circuit, an error amplifier, a compensation network, control logic, and a signal generator. Without limitation, these circuits of the controller 140 enable smoother operating mode transitions (e.g., transitioning from light load DCM to light load FCCM) compared to a conventional approach. In some examples, light load DCM refers to the load current being less than a threshold during DCM. Similarly, light load FCCM refers to the load current being less than a threshold during FCCM.

In some example embodiments, the controller 140 is configured to control drive signals HS_CS (for the HS switch 126) and LS_CS (for the LS switch 130) based on: detecting an operating mode transition; and during the operating mode transition, increasing $I_{OFFSET}$ at a target ramp rate and selectively injecting charge to the compensation network. In some example embodiments, the target ramp rate is a function of a transconductance of the error amplifier of the controller 140 and a target $V_{OUT}$ drop.

In some example embodiments, the controller 140 is configured to initiate a pause switching interval during the operating mode transition in response to $V_{OUT}$ from the boost converter power stage 110 being greater than a first threshold above a target $V_{OUT}$. The controller 140 is also configured to inject charge to the compensation network in response to detecting a condition indicating there will be no more pause switching intervals during the operating mode transition. The condition includes, for example, $V_{OUT}$ dropping below a second threshold between the first threshold and the target $V_{OUT}$. In some example embodiments, the controller 140 is configured stop injecting charge to the compensation network after a predetermined amount of charge is injected to the compensation network. In other example embodiments, the controller 140 is configured stop injecting charge to the compensation network after a predetermined amount of charge injection time.

In some example embodiments, the controller 140 is configured to increase an $I_{OFFSET}$ ramp rate relative to the target ramp rate in response to the pause switching interval being initiated. If the pause switching interface is not initiated, the $I_{OFFSET}$ ramp rate is based on the target ramp rate. In some example embodiments, the controller 140 includes a discharge circuit coupled to the power output 114. In such example embodiments, the controller 140 is configured to selectively activate the discharge circuit to shorten a given pause switching interval.

With the controller 140, $V_{OUT}$ stability (relative to a target $V_{OUT}$) during an operating mode transition (e.g., from a first light load operating mode to a second light load operating mode) is based on: $I_{OFFSET}$ ramp rate control (part of valley current sensing); pause switching control to keep $V_{OUT}$ from exceeding the target $V_{OUT}$ by more than a treshold; discharge control to selectively expedite reduction of $V_{OUT}$; and charge control to selectively reduce $V_{OUT}$ drop.

For the $I_{OFFSET}$ ramp rate control, the controller 140 increases $I_{OFFSET}$ at a rate that enables the reference current ($I_{REF}$) (one of the inputs to the error amplifier) to increase and cancel the effect of $I_{OFFSET}$ with an adjustment to $V_{OUT}$. For the pause switching control, the controller 140 selectively stops switching operations (e.g., HS_CS and LS_CS are controlled so that the HS switch 126 and the LS switch 130 are off). In some example embodiments, the pause switching control stops switching operations when $V_{OUT}$ is higher than the target $V_{OUT}$ by a predetermined amount. In this manner, $V_{OUT}$ is maintained close to the target $V_{OUT}$ from getting out of control when offset current is small and load is light. For discharge control, the controller 140 selectively activates a discharge at the power output 114 to ensure the duration of the pause switching interval enables the loop to respond to the $I_{OFFSET}$ ramp. For the change control, the controller 140 selectively applies a charge to charge input (e.g., an integrating node) of the compensation network. In some example embodiments, the charge opreations are applied after a pause switching interval and a determination that there will be no more pause switching intervals during the operating mode transition. The one-time compensation is needed because the transconductance ($G_m$) stage (i.e., the error amplifier) of the controller 140 works in low-clamped state when switching is paused. As a result, the integrating node of the compensation network settles to a low-clamped value due to $I_{REF}$ (used to trigger low-clamping) being reduced during the low-power condition. When applied, the one-time compensation helps the $G_m$ stage recover the integrating node voltage and reduce $V_{OUT}$ drop.

Figure 2:
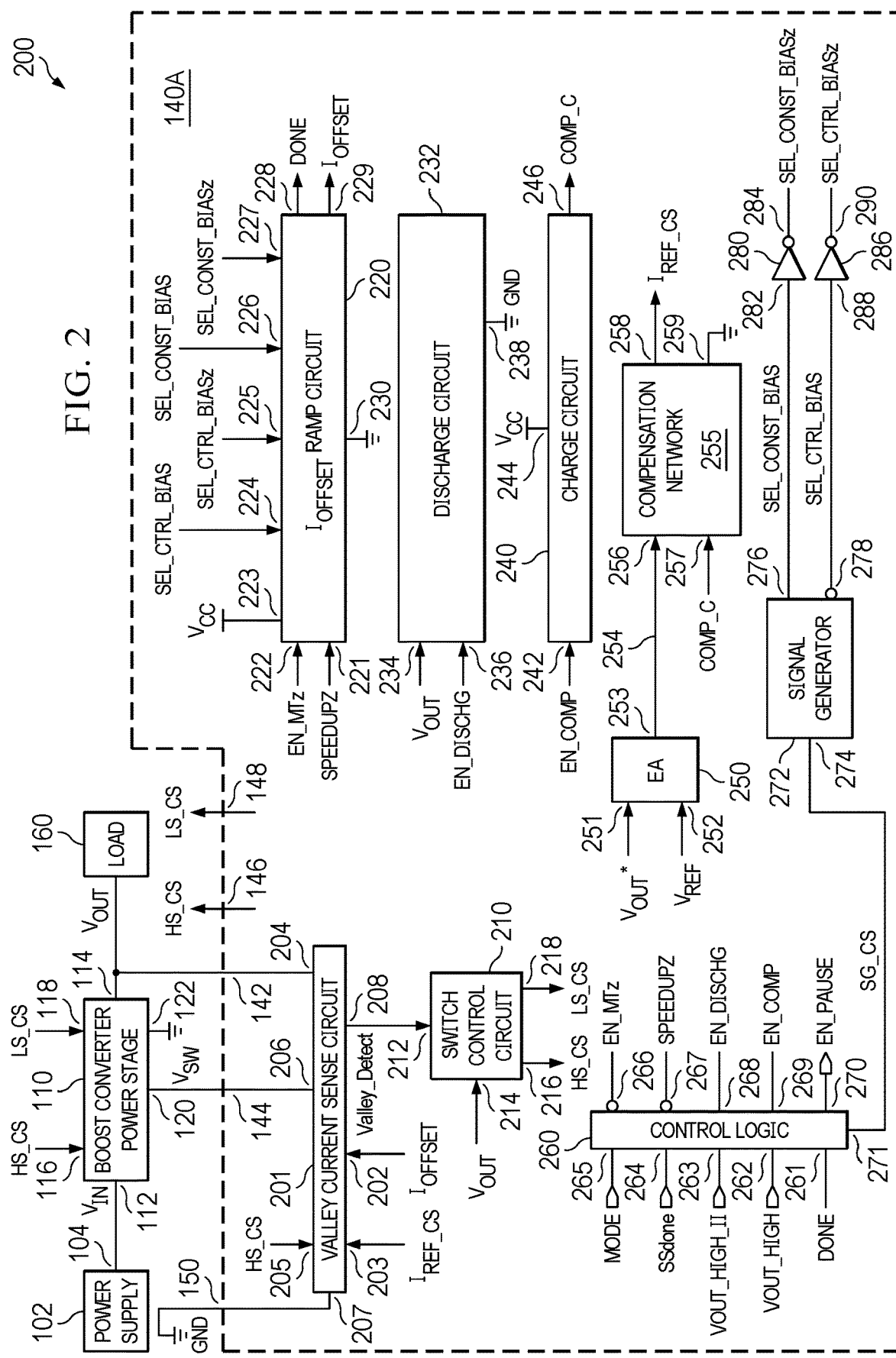
FIG. 2 is another block diagram showing a system in accordance with an example embodiment.

FIG. 2 is another block diagram showing a system 200 in accordance with an example embodiment. In the system 200, the boost converter power stage 110 regulates power to the load 160 based on VIN from the power supply 102. In operation, the boost converter power stage 110 is configured to: receive VIN at the power input 112; receive HS_CS at the first control input 116; receive LS_CS at the second control input 118; and regulate $V_{OUT}$ at the power output 114 relative to a target $V_{OUT}$ responsive to the HS_CS, LS_CS, and the demand of the load 160. In the example of FIG. 2, the boost converter power stage 110 is also configured to provide $V_{SW}$ to the sense output 120.

In the example of FIG. 2, HS_CS and LS_CS are provided by the controller 140A (an example of the controller 140 in FIG. 1) based on the operations of various circuits, including: a valley current sense circuit 201; a switch control circuit 210; an $I_{OFFSET}$ ramp circuit 220; a discharge circuit 232; a charge circuit 240; an error amplifier (labeled "EA") 250; a compensation network 255; and a signal generator 272.

In the example of FIG. 2, the valley current sense circuit 201 includes an $I_{OFFSET}$ input 202. In other example embodiments, the $I_{OFFSET}$ ramp circuit 220 is part of the valley current sense circuit 201. In such embodiments, $I_{OFFSET}$ in internal and the $I_{OFFSET}$ input 202 is omitted. As shown, the valley current sense circuit 201 of FIG. 2 also includes a $I_{REF}$ control signal ($I_{REF}$_CS) input 203, a first sense circuit input 204, a control input 205, a second sense circuit input 206, a ground terminal 207, and sense circuit output 208. In operation, the valley current sense circuit 201 is configured to enable valley current sensing responsive to HS_CS received at the control input 205. Once sensing is enabled, the valley current sensing circuit 201 is configured to provide a valley detection signal (Valley_Detect) at the sense circuit output 208 responsive to: $I_{OFFSET}$ received at the $I_{OFFSET}$ input 202 or generated internally; $I_{REF\_CS}$ received at the $I_{REF}$ control signal input 203; $V_{OUT}$ received at the first sense circuit input 204; and $V_{SW}$ received at the second sense circuit input 206.

The $I_{OFFSET}$ ramp circuit 220 includes an adjustment input 221, a ramp generation input 222, a power input 223, a first signal input 224, a second signal input 225, a third signal input 226, a fourth signal input 227, a completion output 228, an $I_{OFFSET}$ output 229, and a ground terminal 230. In operation, the $I_{OFFSET}$ ramp circuit 220 is configured to increase $I_{OFFSET}$ from an initial $I_{OFFSET}$ value to a target $I_{OFFSET}$ responsive to: receiving a power supply ($V_{CC}$) at the power input 223; and receiving an enable signal (EN_MTz) at the ramp generation input 222. Responsive to receiving a speedup signal (SPEEDUPZ) at the adjustment input 221, the $I_{OFFSET}$ ramp circuit 220 is configured to expedite $I_{OFFSET}$ reaching the target $I_{OFFSET}$. In some example embodiments, the $I_{OFFSET}$ ramp circuit 220 is configured to increase an initial $I_{OFFSET}$ value responsive to receiving SPEEDUPZ at the adjustment input 221. In other example embodiments, the $I_{OFFSET}$ ramp circuit 220 may be configured to increase $I_{OFFSET}$ ramp rate responsive to receiving SPEEDUPZ at the adjustment input 221. Bias values of the $I_{OFFSET}$ ramp circuit 220 are selectively based on: a first signal (SEL_CTRL_BIAS) received at the first signal input 224; a second signal (SEL_CTRL_BIASz) received at the second signal input 225; a third signal (SEL_CONST_BIAS) received at the third signal input 226; and a fourth signal (SEL_CONST_BIASz) received at the fourth signal input 227. In some example embodiments, the $I_{OFFSET}$ ramp circuit 220 is configured to: use SEL_CTRL_BIAS and SEL_CTRL_BIASz to set bias values during an operating mode transition; and use SEL_CONST_BIAS and SEL_CONST_BIASz to set bias values during normal operations (e.g., when the load current is greater than a threshold), In some example embodiments, the $I_{OFFSET}$ ramp circuit 220 is configured to ramp up $I_{OFFSET}$ from an initial $I_{OFFSET}$ level to a target $I_{OFFSET}$ level at a target ramp rate. The target ramp rate may be a function of the transconductance of the error amplifier of the controller 140A and a target $V_{OUT}$ drop. Once $I_{OFFSET}$ reaches the target $I_{OFFSET}$ level, the $I_{OFFSET}$ ramp circuit 220 is configured to assert a done signal (DONE) at the completion output 228.

The discharge circuit 232 has a power input 234, an enable input 236 and a ground terminal 238. Responsive to receiving an enable signal (EN_DISCHG) at the enable input 236, the discharge circuit 232 is configured to couple the power output 114 of the boost converter power stage 110 to the ground terminal 238, which reduces $V_{OUT}$ The charge circuit 240 includes an enable input 242, a power input 244 and a charge output 246. Responsive to receiving an enable signal (EN_COMP) at the enable input 242, the charge circuit 240 is configured to provide a charge signal (COMP_C) at the charge output 246 based on $V_{CC}$ at the power input 244. In different example embodiments, COMP_C is provided for a predetermined duration or until a predetermined amount of charge is provided to the charge output 246.

The error amplifier 250 includes a first amplifier input 251, a second amplifier input 252 and an error output 253. In operation, the error amplifier 250 is configured to provide an error result 254 responsive to a $V_{OUT}$ sense signal ($V_{OUT}^*$) received at the first amplifier input 251 and a reference voltage ($V_{REF}$) received at the second amplifier input 252.

The compensation network 255 includes an error input 256, a charge input 257, an $I_{REF}$ control output 258 and a ground terminal 259. In operation, the compensation network 255 is configured to provide $I_{REF}$_CS at the $I_{REF}$ control output 258 responsive to the error result 254 received at the error input 256 and COMP_C received at the charge input 257. In some example embodiments, $I_{REF}$_CS is provided to a voltage-to-current (V2I) converter to generate $I_{REF}$. In some example embodiments, one or more of such V2I converters are included with the valley current sense circuit 201. In some example embodiments, $I_{REF}$_CS is provided to a voltage-to-current (V2I) converter to generate $I_{REF}$.

The signal generator 272 includes a control input 274, a first non-overlapping signal output 276, and a second non-overlapping signal output 278. In operation, the signal generator 272 is configured to provide a first signal (SEL_CONST_BIAS) at the first non-overlapping signal output 276 and a second signal (SEL_CTRL_BIAS) at the second non-overlapping signal output 278 responsive to a signal generator control signal (SG_CS) received at the control input 274.

As shown, controller 140A also includes a first inverter 280 and a second inverter 286. The first inverter 280 has a first inverter input 282 and a first inverter output 284. In the example of FIG. 2, the first inverter input 282 is coupled to the first non-overlapping signal output 276. In operation, the first inverter 280 is configured to receive SEL_CONST_BIAS at the first inverter input 282 and provide the inverse signal (SEL_CONST_BIASz) at the first inverter output 284. The second inverter 286 has a second inverter input 288 and a second inverter output 290. In operation, the second inverter 286 is configured to receive SEL_CTRL_BIAS at the second inverter input 288 and provide the inverse signal (SEL_CTRL_BIASz) at the second inverter output 290.

The control logic 260 includes a first control input 261, a second control input 262, a third control input 263, a fourth control input 264, a fifth control input 265, a first control output 266, a second control output 267, a third control output 268, a fourth control output 269, a fifth control output 270, and a sixth control output 271. In operation, the control logic 260 is configured to: provide an enable $I_{OFFSET}$ ramp signal (e.g., EN_MTz) at the first control output 266; provide a speed up signal (e.g., SPEEDUPZ) at the second control output 267; provide an enable discharge signal (e.g., EN_DISCHG) at the third control output 268; provide an enable charge signal (e.g., EN_COMP) at the fourth control output 269; provide an enable pause signal (e.g., EN_PAUSE) at the fifth control output 270; and provide a signal generator control signal (e.g., SG_CS) at the sixth control output 271. The signals provided by the control logic 260 are provided as needed to perform the operations described herein responsive to: a $I_{OFFSET}$ ramp completion signal (e.g., DONE) received at the first control input 261; a first $V_{OUT}$ high threshold (e.g., VOUT_HIGH) received at the second control input 262; a second $V_{OUT}$ high threshold (e.g., VOUT_HIGH_II) received at the third control input 263; a soft start done signal (e.g., SSdone) received at the fourth control input 264; and/or a mode signal (e.g., MODE) received at the fifth control input 265.

In some example embodiments, the control logic 260 is configured to provide EN_MTz at the first control output 266 responsive to detecting an operating mode transition (e.g., assertion of the SSdone signal). In some example embodiments, the control logic 260 is configured to provide SPEEDUPZ at the second control output 267 responsive to a pause switching interval being initiated during the operating mode transition. In some example embodiments, the control logic 260 is configured to provide EN_DISCHG at the third control output 268 responsive to EN_PAUSE being provided at the fifth control output 270. In some example embodiments, the control logic 260 is configured to provide EN_COMP at the fourth control output 269 responsive to a condition indicating there will be no more pause switching intervals during the operating mode transition. In some example embodiments, the condition is $V_{OUT}$ dropping from VOUT_HIGH_II to below VOUT_HIGH. In some example embodiments, the control logic 260 is configured to provide EN_PAUSE at the fifth control output 270 responsive to $V_{OUT}$ reaching VOUT_HIGH_II. In some example embodiments, the control logic 260 is configured to provide SG_CS at the sixth control output 271 responsive to the DONE signal being received at the first control input 261.

As previously noted, the signal generator 272 is configured to generate SEL_CONST_BIAS and SEL_CTRL_BIAS responsive to SG_CS. Most of the time (during normal operations in which a normal load demand is present), SEL_CONST_BIAS and SEL_CONST_BIASz are used by the $I_{OFFSET}$ ramp circuit 220. During a given operating mode transition (e.g., light load DCM to light load FCCM), SEL_CTRL_BIAS and SEL_CTRL_BIAS are used by the $I_{OFFSET}$ ramp circuit 220 to ramp up $I_{OFFSET}$ at a target ramp rate.

The switch control circuit 210 includes a control input 212, a sense input 214, a first control output 216, and a second control output 218. In operation, the switch control circuit 210 is configured to: receive the Valley_Detect signal at the control input 212; receive $V_{OUT}$ at the sense input 214; provide HS_CS at the first control output 216 responsive to the Valley_Detect signal and $V_{OUT}$; and provide LS_CS at the second control output 218 responsive to the Valley_Detect signal and $V_{OUT}$. In some example embodiments, the switch control circuit 210 includes circuitry for determining an on-time and off-time for HS_CS and the related HS switch 126. The switch control circuit 210 controls LS_CS to be complementary to HS_CS (i.e., when HS_CS is high, LS_CS is low; and when HS_CS is low, LS_CS is high) unless switching is paused. With the controller 140A and related operations, $V_{OUT}$ drops are maintained within a target tolerance during a given operating mode transition (e.g., light load DCM to light load FCCM).

Figure 3:
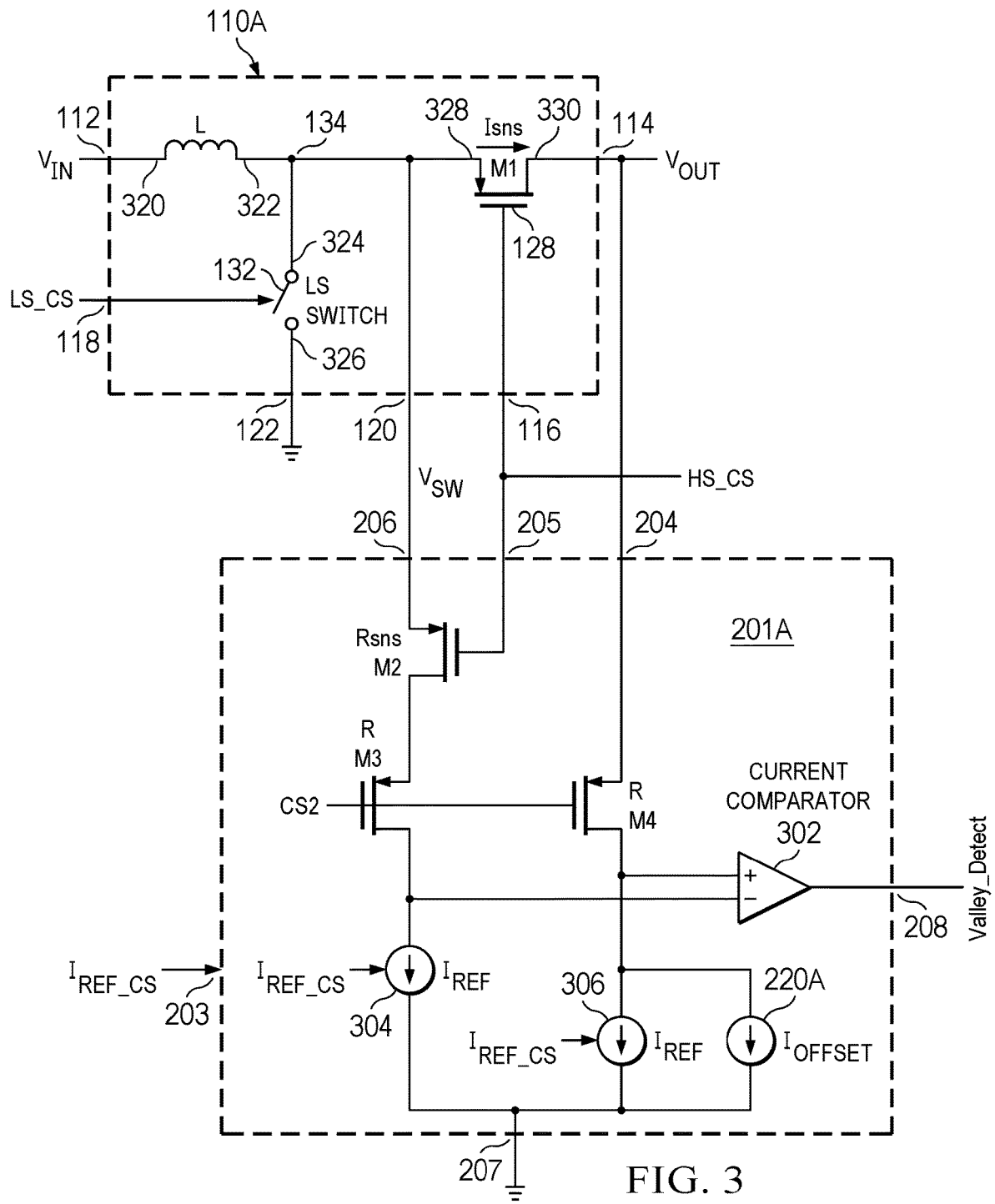
FIG. 3 is a schematic diagram showing a boost converter power stage and a valley current sense circuit in accordance with an example embodiment.

FIG. 3 is a schematic diagram showing a boost converter power stage 110A (an example of the boost converter power stage 110 in FIGS. 1 and 2) and a valley current sense circuit 201A (an example of the valley current sense circuit 201 in FIG. 2) in accordance with an example embodiment. In some example embodiments, the boost converter power stage 110A includes: an inductor (labeled L); a transistor (M1) operating as the HS switch (e.g., the HS switch 126 in FIG. 1) of the boost converter power stage 110A; and a LS switch (e.g., the LS switch 130 in FIG. 1) of the boost converter power stage 110A in the arrangement shown in FIG. 3. Specifically, a first side 320 of L is coupled to the power input 112. A second side 322 of L is coupled to the switch node 134. A first current terminal 324 of the LS switch is also coupled to the switch node 134. A second current terminal 326 of the LS switch is coupled to the ground terminal 122. The control terminal 132 of the LS switch is coupled to the second control input 118. In operation, the boost converter power stage 110A is configured to receive LS_CS at the second control input 118. A first current terminal 328 of M1 (the HS switch in FIG. 3) is coupled to the switch node 134. A second current terminal 330 of M1 is coupled to the power output 114. The control terminal 128 of M1 is coupled to the first control input 116. In operation, the boost converter power stage 110A is configured to receive HS_CS at the first control input 116. The sense output 120 is coupled to the switch node 134. In operation, the boost converter power stage 110A is configured to provide $V_{SW}$ at the sense output 120.

In some example embodiments, the valley current sense circuit 201A includes: transistors M2, M3, M4; $I_{REF}$ sources 304 and 306; an $I_{OFFSET}$ ramp circuit 220A (an example of the $I_{OFFSET}$ ramp circuit 220 in FIG. 2); and a current comparator 302 in the arrangement shown in FIG. 3. Specifically, a first current terminal of M2 (note: M2 has a resistance Rsns when on) is coupled to the second sense circuit input 206. A second current terminal of M2 is coupled to a first current terminal of M3 (note: M3 has a resistance R when on). A control terminal of M2 is coupled to the control input 205. The second current terminal of M3 is coupled to a first side of the $I_{REF}$ source 304. The second side of the $I_{REF}$ source 304 is coupled to the ground terminal 207. The first current terminal of M4 is coupled to the first sense circuit input 204. The second current terminal of M4 is coupled to a first side of the $I_{REF}$ source 306. In the example of FIG. 3, the control terminals of M3 and M4 receive a control signal (CS2), which may be provided responsive to the HS switch being on (or related current flow being available). The second side of the $I_{REF}$ source 306 is coupled to the ground terminal 207. The second current terminal of M4 is also coupled to a first side of the $I_{OFFSET}$ ramp circuit 220A. The second side of the $I_{OFFSET}$ ramp circuit 220A is coupled to the ground terminal 207. In the example of FIG. 3, the current comparator 302 includes a non-inverting ("+") input, an inverting ("−") input, and a comparator output. The non-inverting ("+") input of the current comparator 302 is coupled to the second current terminal of M4. The inverting ("−") input of the current comparator 302 is coupled to the second current terminal of M3. The output of the current comparator 302 is coupled to the sense circuit output 208. In operation, the current comparator 302 provides the Valley_Detect signal responsive to a sense current (Isns) reaching a valley level threshold. In some example embodiments, the valley level threshold is a function of $I_{OFFSET}$. In some example embodiments, Isns is adjustable based on $I_{REF}$ and $I_{OFFSET}$, where $I_{OFFSET}$ is a constant except during ramp up and $I_{REF}$ is controlled based on the error amplifier operations (i.e., $I_{REF}$ varies as the load varies).

Figure 4:
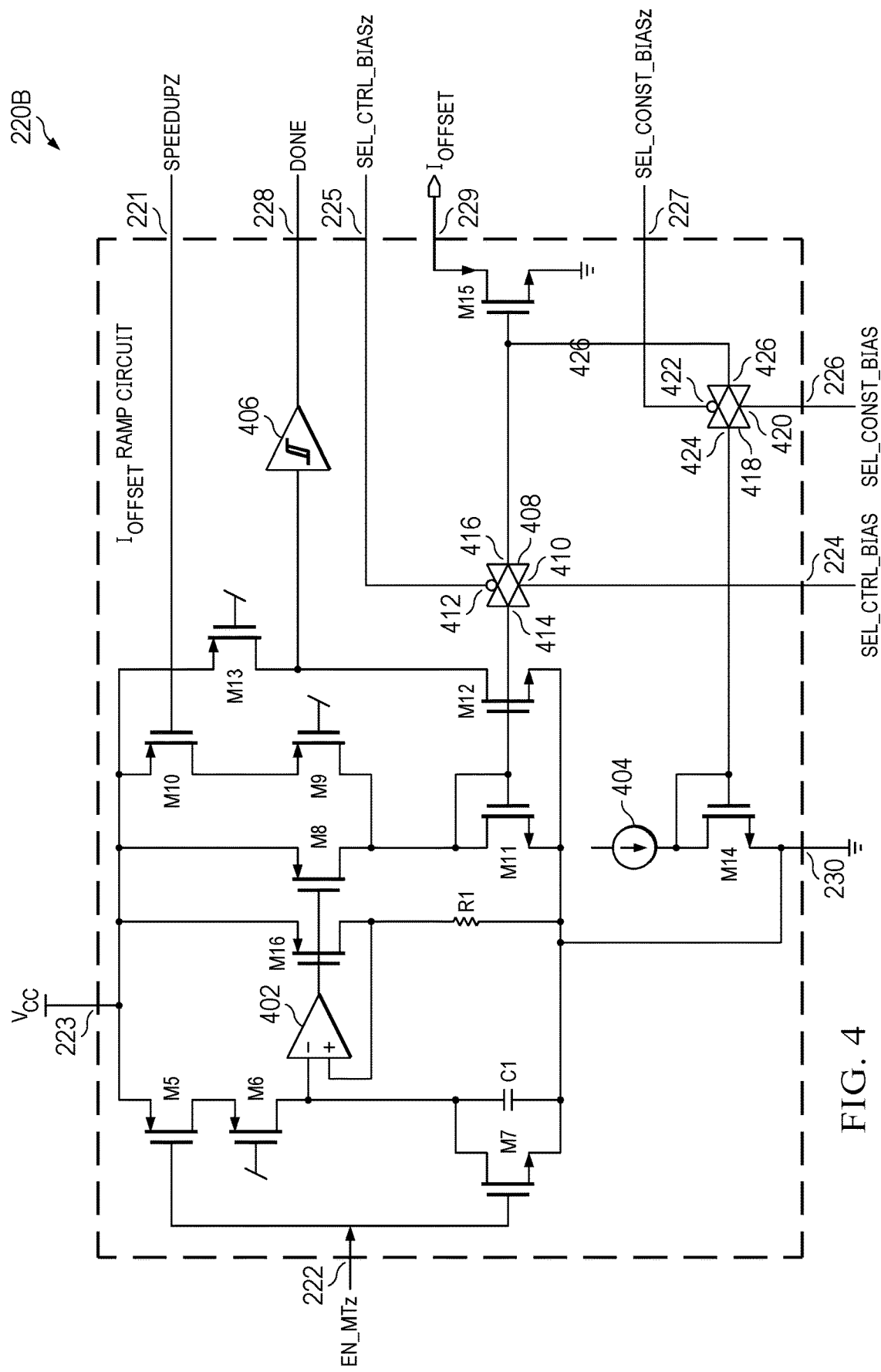
FIG. 4 is a schematic diagram showing an offset current ($I_{OFFSET}$) ramp circuit in accordance with an example embodiment.

In some example embodiments, the valley current sense circuit 201A is configured to enable valley current sensing responsive to HS_CS received at the control input 205. Once sensing is enabled, the valley current sensing circuit 201A is configured to provide Valley_Detect at the sense circuit output 208 responsive to: $I_{OFFSET}$ provided by the $I_{OFFSET}$ ramp circuit 220A; $I_{REF}$_CS received at the $I_{REF}$ control signal input 203, $V_{OUT}$ received at the first sense circuit input 204, and $V_{SW}$ received at the second sense circuit input 206. FIG. 4 is a schematic diagram showing an $I_{OFFSET}$ ramp circuit 220B (an example of the $I_{OFFSET}$ ramp circuit 220 in FIG. 2, or the $I_{OFFSET}$ ramp circuit 220A in FIG. 3) in accordance with an example embodiment. In some example embodiments, the $I_{OFFSET}$ ramp circuit 220B includes transistors M5 to M15 (each having a respective first current terminal, a respective second current terminal, and a respective control terminal), an operational amplifier 402, a capacitor (C1), a resistor (R1), a current source 404, a Schmitt trigger 406, and first and second transmission gates 408 and 418 in the arrangement shown in FIG. 4.

In the example of FIG. 2, the first transmission gate 408 has a first control input 410, a second control input 412, a transmission input 414, and a transmission output 416. The second transmission gate 418 has a first control input 420, a second control input 422, a transmission input 424, and a transmission output 426. In some example embodiments, each of the first and second transmission gates 408 and 418 includes a p-channel FET (PFET) and an n-channel FET (NFET), where one of the PFET and NFET is always on. Each of the first and second transmission gates 408 and 418 provides relatively low resistance when there is not enough gate-to-source voltage ($V_{GS}$) for FET operations.

In the example of FIG. 4, the first current terminal of M5 is coupled to the power input 223. The second current terminal of M5 is coupled to the first current terminal of M6. The second current terminal of M6 is coupled to the first current terminal of M7 and a first side of C1. The second current terminal of M7 and the second side of C1 are coupled to the ground terminal 230.

The first current terminal of M16 is coupled to power input 223 (e.g., to receive $V_{CC}$). The second current terminal of M16 is coupled to a first side of R1. The second side of R1 is coupled to the ground terminal 230. The first current terminal of M8 is coupled to the power input 223. The second current terminal of M8 is coupled to a first current terminal of M11. The second current terminal of M11 is coupled to the ground terminal 230. The first current terminal of M10 is coupled to the power input 223. The second current terminal of M10 is coupled to the first current terminal of M9. The second current terminal of M9 is coupled to the first current terminal of M11. The first current terminal of M13 is coupled to the power input 223. The second current terminal of M13 is coupled to the first current terminal of M12. The first current terminal of 14 is coupled to a current source 404. The second current terminal of M14 is coupled to the ground terminal 230. The first current terminal of M15 is coupled to the $I_{OFFSET}$ output 229. The second current terminal of M15 is coupled to a ground terminal (e.g., the ground terminal 230). The control terminal of M15 is coupled to the transmission output 416 of the first transmission gate 408 and to the transmission output 426 of the second transmission gate 418. During normal operations (e.g., when the load current is greater than a threshold), $I_{OFFSET}$ is constant and is based on current from the current source 404 and biasing provided by the second transmission gate 418. During an operation mode transition (e.g., light load DCM to light load FCCM), $I_{OFFSET}$ ramps up and is based on current from a current mirror using M11 and M12 as well as biasing provided by the first transmission gate 408.

As shown in FIG. 4, the inverting ("−") input of the operational amplifier 402 is coupled to the second current terminal of M6. The non-inverting ("+") input of the operational amplifier 402 is coupled to the second current terminal of M16. The output of the operational amplifier 402 is coupled to the control terminals of M16 and M8. The control terminals of M5 and M7 are coupled to the ramp generation input 222. In operation, the $I_{OFFSET}$ ramp circuit 220B is configured to receive EN_MTz at the ramp generation input 222. The control terminals of M6, M9, and M13 are coupled to the power input 223. The control terminals of M7 and M8 are coupled to the output of the operational amplifier 402. The control terminal of M10 is coupled to the adjustment input 221. In operation, the $I_{OFFSET}$ ramp circuit 220B is configured to receive SPEEDUPz at the adjustment input 221. The control terminals of M11 and M12 are coupled to each other and to the second current terminals of M8 and M9. The control terminals of M11 and M12 are also coupled to the transmission input 414 of the first transmission gate 408. The first control input 410 of the first transmission gate 408 is coupled to the first signal input 224. In operation, the $I_{OFFSET}$ ramp circuit 220B is configured to receive SEL_CTRL_BIAS at the first signal input 224. The second control input 412 of the first transmission gate 408 is coupled to the second signal input 225. In operation, the $I_{OFFSET}$ ramp circuit 220B is configured to receive SEL_CTRL_BIASz at the second signal input 225. The control terminal of M14 is coupled to the transmission input 424 of the second transmission gate 418 and the first current terminal of M14. The first control input 420 of the second transmission gate 418 is coupled to the third signal input 226. In operation, the $I_{OFFSET}$ ramp circuit 220B is configured to receive SEL_CONST_BIAS at the third signal input 226. The second control input 422 of the second transmission gate 418 is coupled to the fourth signal input 227. In operation, the $I_{OFFSET}$ ramp circuit 220B is configured to receive SEL_CONST_BIASz at the fourth signal input 227.

When enabled by receipt of EN_MTz at the ramp generation input 222, the $I_{OFFSET}$ ramp circuit 220B is configured to ramp up $I_{OFFSET}$ at the $I_{OFFSET}$ output 229 responsive to a set of bias control signals (e.g., SEL_CTRL_BIAS and SEL_CTRL_BIASz during an operating mode transition). If needed, SPEEDUPZ is used to expedite $I_{OFFSET}$ reaching a target $I_{OFFSET}$.

In some example embodiments, the $I_{OFFSET}$ ramp circuit 220B is only enabled (e.g., EN_MTz is high) when there is a target operating mode transition. For example, the MODE signal provided by the control logic 260 may indicate when there is a target operating mode transition. As described herein, the operations of the $I_{OFFSET}$ ramp circuit 220B relate to several signals, including: EN_MTz; DONE; and SPEEDUPz. Again, EN_MTz is the enable signal for the $I_{OFFSET}$ ramp circuit 220B. When there is sufficient bias current (a function of the total $I_{OFFSET}$ and the current mirror ratio formed using M12 to M15) and the operating mode transition is complete, the $I_{OFFSET}$ ramp circuit 220B provide DONE to the completion output 228. In the example of FIG. 4, a current comparison performed by the Schmitt trigger 406 (between the second current terminal of M13 and the completion output 228) is used to determine when there is enough bias current and the operating mode transition is finished.

In some example embodiments, the $I_{OFFSET}$ ramp circuit 220B is configured to expedite ramping up $I_{OFFSET}$ responsive to receiving SPEEDUPz at the adjustment input 221. As an example, control logic (e.g., control logic 260 in FIG. 2) may be configured to provide SPEEDUPz responsive to a pause switching interval during the given operating mode transition. When SPEEDUPz is not asserted, $I_{OFFSET}$ ramps up from an initial $I_{OFFSET}$ value to a target $I_{OFFSET}$ value during the given operating mode transition. When SPEEDUPz is asserted, $I_{OFFSET}$ ramps up more quickly (e.g., by increasing the initial $I_{OFFSET}$ value, increasing the ramp rate, or adding to $I_{OFFSET}$ in a step up approach). In some example embodiments, $I_{speedup}$ has a boundary defined by $I_{REF}$ of the $G_m$ stage (the error amplifier 250) when it is low-clamped. This boundary may be calculated, for example using Equation 2.

$$I_{speedup} = \frac{R_{sns}}{R} I_{REF_{clamped}} \text{ where } I_{REF_{clamped}} \text{ is } I_{REF} \text{ when low} - \text{clamped} \quad (2)$$

For Equation 2, Rsns is the resistance of M2 in FIG. 3, R is the resistance of M3 and M4 in FIG. 3, and $I_{REF_{clamped}}$ is $I_{REF}$ of the $R_{sns}$. When SPEEDUPz is asserted, the amount of discharge time is reduced, which improves thermal behavior.

In some example embodiments, the $I_{OFFSET}$ ramp circuit 220B includes: ramp generation circuitry having a first control input and a first current output; ramp adjustment circuitry having a second control input and a second current output; current scaling circuitry having a first current input, a current sense output and an offset current output; and ramp completion circuitry having an offset current input and a completion output. With regard to FIG. 4, example ramp generation circuitry includes M5, M6, M7, M8, M16 and the operational amplifier 402. In this example, the control terminal of M5 and/or the control terminal of M7 are example first control inputs of the ramp generation circuitry. The second current terminal of M8 is an example first current output of the ramp generation circuitry. Example ramp adjustment circuitry in FIG. 4 includes M10. In this example, the control terminal of M10 is an example second control input of the ramp adjustment circuitry. The second current terminal of M10 is an example second current output of the ramp adjustment circuitry. Example current scaling circuitry in FIG. 4 includes M11, M12 and M15. In this example, the control terminals of M11, M12 and M15 along with the first current terminal of M11 are example first current inputs of the current scaling circuitry. The first current terminal of M12 is an example current sense output of the current scaling circuitry. The first current terminal of M15 is an example offset current output of the current scaling circuitry. Example ramp completion circuitry in FIG. 4 includes M13 and the Schmitt trigger 406. In this example, the Schmitt trigger input is an example offset current input of the ramp completion circuitry. The Schmitt trigger output is an example completion output of the ramp completion circuitry.

In the example of FIG. 4, the first control output 266 of the control logic 260 is coupled to the first control input of the ramp generation circuitry via the ramp generation input 222. The second control output 267 of the control logic 260 is coupled to the second control input of the ramp adjustment circuitry via the adjustment input 221. The first current output of the ramp generation circuitry is coupled to the first current input of the current scaling circuitry. The second current output of the ramp adjustment circuitry is also coupled to the first current input of the current scaling circuitry. The current sense output of the current scaling circuitry is coupled to the current sense input of the ramp completion circuitry. The offset current output of the current scaling circuitry is coupled to the $I_{OFFSET}$ output 229. The completion output of the ramp completion circuitry is coupled to the first control input 261 of the control logic 260 via the completion output 228.

Figure 5:
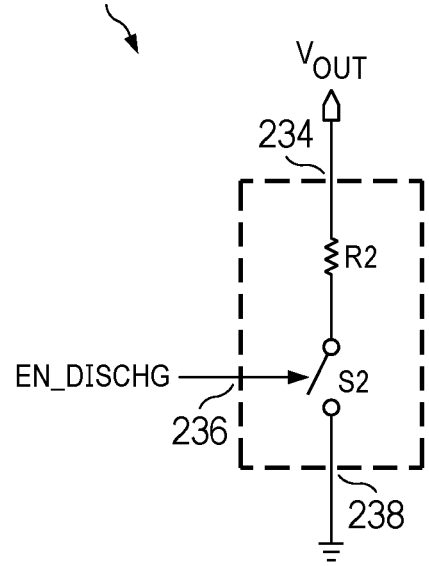
FIG. 5 is a schematic diagram showing a discharge circuit in accordance with an example embodiment.

FIG. 5 is a schematic diagram showing a discharge circuit 232A (an example of the discharge circuit 232 in FIG. 2) in accordance with an example embodiment. In the example of FIG. 5, the discharge circuit 232A includes a resistor (R2) and a switch (S2) in series between the power input 234 and the ground terminal 238. The control terminal of S2 is coupled to the enable input 236 of the discharge circuit 232A. In operation, the discharge circuit 232A is configured to couple the power output 114 related to $V_{OUT}$ to the ground terminal 238 responsive to EN_DISCHG being received at the enable input 236. Specifically, when EN_DISCHG is asserted, S2 is closed to activate discharge at the power output 114, which reduces $V_{OUT}$. In some example embodiments, control logic (e.g., the control logic 260 in FIG. 2) is configured to provide EN_DISCHG responsive to EN_PAUSE being provided (e.g., to reduce the duration of a pause switching interval or the related operating mode transition).

Figure 6:
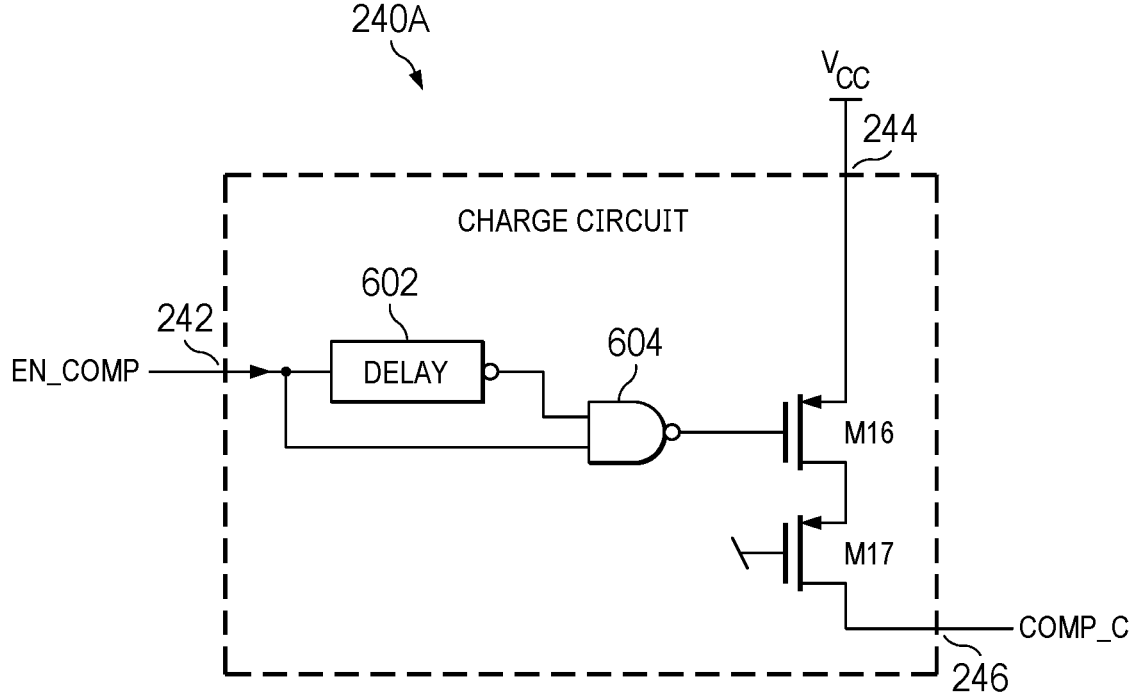
FIG. 6 is a schematic diagram showing a one-time compensation circuit in accordance with an example embodiment.

FIG. 6 is a schematic diagram showing a charge circuit 240A (an example of the charge circuit 240 in FIG. 2) in accordance with an example embodiment. In the example of FIG. 6, the charge circuit 240A includes: M16; M17; a delay circuit 602; and a NAND gate 604 in the arrangement shown. Specifically, the delay circuit 602 is coupled to the enable input 242. In operation, the charge circuit 240A is configured to receive EN_COMP at the enable input 242. The output of the delay circuit 602 is coupled to a first input of the NAND gate 604. The second input of the NAND gate 604 is coupled to the enable input 242. Also, the first current terminal of M16 is coupled to the power input 244. The second current terminal of M16 is coupled to the first current terminal of M17. The second current terminal of M17 is coupled to the charge output 246.

As shown, the control terminal of M16 is coupled to the output of the NAND gate 604, while the control terminal of M17 is coupled to the power input 244. In operation, the charge circuit 240A is configured to provide COMP_C at the charge output 246 responsive to EN_COMP and a delay (e.g., based on the delay of the delay circuit 602). In some example embodiments, control logic (e.g., the control logic 260 in FIG. 2) is configured to provide EN_COMP responsive to a detectable condition indicating that there will be no more pause switching intervals during a given operating mode transition. In some example embodiments, the detectable condition is $V_{OUT}$ dropping from VOUT_HIGH_II to $V_{OUT}$ HIGH. In some example embodiments, VOUT_HIGH_II is lower than a pulse frequency modulation (PFM) threshold and a deglitch time larger than 10 us (a function of the switching frequency of the HS switch 126 and the LS switch 130) is used so that $V_{OUT}$ returns to target $V_{OUT}$ value. The purpose of the charge circuit 240A is to inject a target quantity of charge to a compensation capacitor (e.g., $C_C$ in FIG. 7). In some example embodiments, a target charge quantity is defined by an expected voltage change $\Delta V_{comp}$. In such example embodiments, a current $I_{comp}$ and a pulse time $\Delta T_{comp}$ may be used to provide the compensation charge, where $I_{comp}$ is a function of $V_{CC}$ and the resistances of M16 and M17 when turned on. Meanwhile, $\Delta T_{comp}$ may be based on $I_{comp}$ and the target charge quantity.

Figure 7:
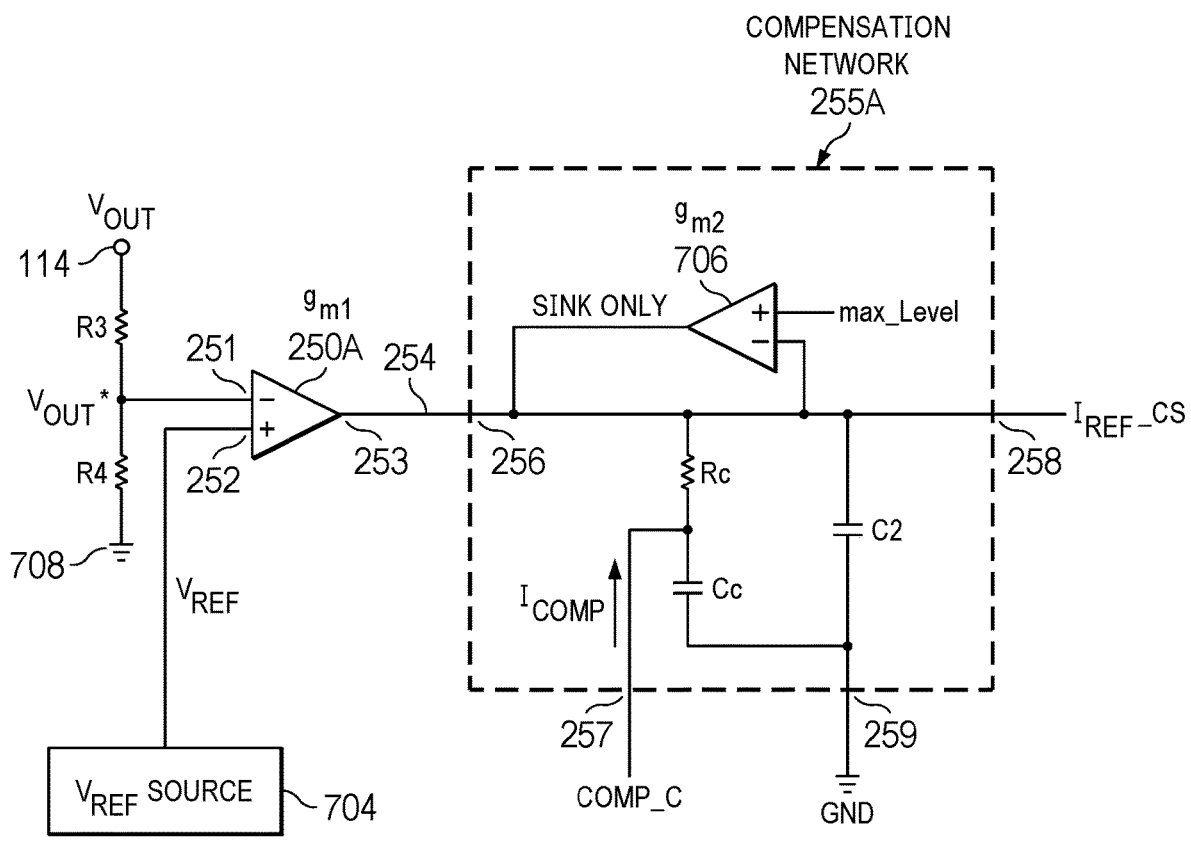
FIG. 7 is a schematic diagram showing an error amplifier and compensation network circuit in accordance with an example embodiment.

FIG. 7 is a schematic diagram showing an error amplifier 250A (an example of the error amplifier 250 in FIG. 2) and compensation network 255A (an example of the compensation network 255 in FIG. 2) in accordance with an example embodiment. In the example of FIG. 7, the error amplifier 250A is an operational transconductance amplifier having the first amplifier input 251 (e.g., an inverting ("−") input), the second amplifier input 252 (e.g., a non-inverting ("+") input), and the error output 253. In operation, the error amplifier 250A is configured to provide the error results 254 responsive to $V_{OUT}^*$ received at the first amplifier input 251 and $V_{REF}$ received at the second amplifier input 252. In the example of FIG. 7, $V_{REF}$ is provided a $V_{REF}$ source 704. In the example of FIG. 7, $V_{OUT}^*$ is obtained using a voltage divider having resistors R3 and R4 in series between the power output 114 and a ground terminal 708. In this example, $V_{OUT}^*$ is a scaled version of $V_{OUT}$.

As shown, the compensation network 255A includes an operational transconductance amplifier 706 and compensation circuitry formed by resistor (Rc), Cc, and another capacitor (C2) in the arrangement shown. In some example embodiments, the operational transconductance amplifier 706 operates as a V2I converter having a low-clamp threshold. In the example of FIG. 7, the error amplifier 250A has a first voltage-to-current ratio ($g_{m1}$), while the operational transconductance amplifier 706 has a second voltage-to-current ratio ($g_{m2}$)

In the example of FIG. 7, the non-inverting ("+") input of the operational transconductance amplifier 706 is configured to receive a maximum clamp threshold (max_Level), where max_Level is the maximum inductor current. As previously noted, $I_{REF}$ is used for valley current sensing and may be generated using a V2I converter based on $I_{REF}\_CS$. For a maximum inductor current, there will be a maximum V2I current and a related scaled V2I value (e.g., related to the operational transconductance amplifier 706). In some example embodiments, max_Level is a scaled value determined based on the maximum inductor current.

In the example of FIG. 7, the inverting ("−") input of the operational transconductance amplifier 706 is coupled to the error input and the $I_{REF}$ control output 258. The output of the operational transconductance amplifier 706 is also coupled to the error input 256 and the $I_{REF}$ control output 258. As shown, a first side of Rc is coupled to the error input 256 and the $I_{REF}$ control output 258. A second side of Rc is coupled to the charge input 257 and a first side of Cc. The second side of Cc is coupled to the ground terminal 259. The first side of C2 is coupled to the error input 256 and the $I_{REF}$ control output 258. The second side of C2 is coupled to the ground terminal 259.

In operation, the error amplifier 250A is configured to compare $V_{OUT}^*$ with $V_{REF}$ to detect if $V_{OUT}$ drops below a threshold (e.g., below the target $V_{OUT}$). The error result 254 provided at the error output 253 is used to adjust the inductor current. When the feedback loop settles, $V_{OUT}^*$ should be close to $V_{REF}$. Otherwise, the comparison result of the error amplifier 250A increases, which results in more energy being supplied (to increase $V_{OUT}$) or less energy being supplied (to decrease $V_{OUT}$). During an operating mode transition, control logic (e.g., the control logic 260 in FIG. 2) is configured to provide COMP_C to the charge input 257 in response to an indication that there will be no more pause switching intervals during the operating mode transition. In the example of FIG. 7, COMP_C is used to charge Cc, which enables the control loop related to the error amplifier 250A and the compensation network 255A to recover from a low-load condition reducing the charge on Cc.

With the error amplifier 250A (related to $g_{m1}$) and the operational transconductance amplifier 706, the following sensing equation applies:

$$I_{sns} = K_{sns}\left(I_{ref} - \frac{R}{R_{sns}}I_{offset}\right) \qquad \text{Equation (3)}$$

When the controller 140 settles, there is a $\Delta V$ between the target value and the current output. To select a target $\Delta V$, $I_{offset}$ may be adjusted according to:

$$\frac{\Delta V g_{m1} g_{m2}}{C_C}. \qquad \text{Equation (4)}$$

In Equation 4, $g_{m2}$ is the transconductance of a V2I converter configured to generate $I_{REF}$ based on $I_{REF}\_CS$. Based on Equation 4, the expected ramping rate of $I_{offset}$ is:

$$\frac{\Delta V g_{m1} g_{m2}}{C_C} \frac{R_{sns}}{R}.$$ Equation (5)

To achieve a slower $I_{offset}$ ramp, a larger C1 (see FIG. 4) may be used. In different example embodiments, optimization of the $I_{offset}$ ramp based be based on a target $V_{OUT}$ drop, a target IC area, a target $g_{m1}$ (or related resistance), a target $g_{m2}$ (or related resistance), or other design parameters.

In some example embodiments, $I_{comp}$ (the current used to charge Cc) is given as:

$$I_{comp} = \frac{\Delta V_{comp} C_C}{\Delta T_{comp}}.$$ Equation (6)

If the low-clamped value of COMP_C is designated as $V_{low\_pow}$ (when the controller 140A operates in a low-power mode) and the normal value is designated as $V_{normal}$ (when the controller 140A operates in a normal mode other than a low-power mode), then $\Delta V_{comp}$ is limited by $V_{normal}$-$V_{low\_pow}$. In some example embodiments, $\Delta V_{comp}$ is not adaptive and may be chosen carefully. For example, if $\Delta V_{comp}$ is too high, the $V_{OUT}$ drop is reduced in a light load condition, but COMP_C is slightly overcompensated in light to medium load conditions. In a heavy load condition, the charge operation (e.g., provided by the charge circuit 240 in FIG. 2, or the charge circuit 240A in FIG. 6) is not enabled.

Figure 8:
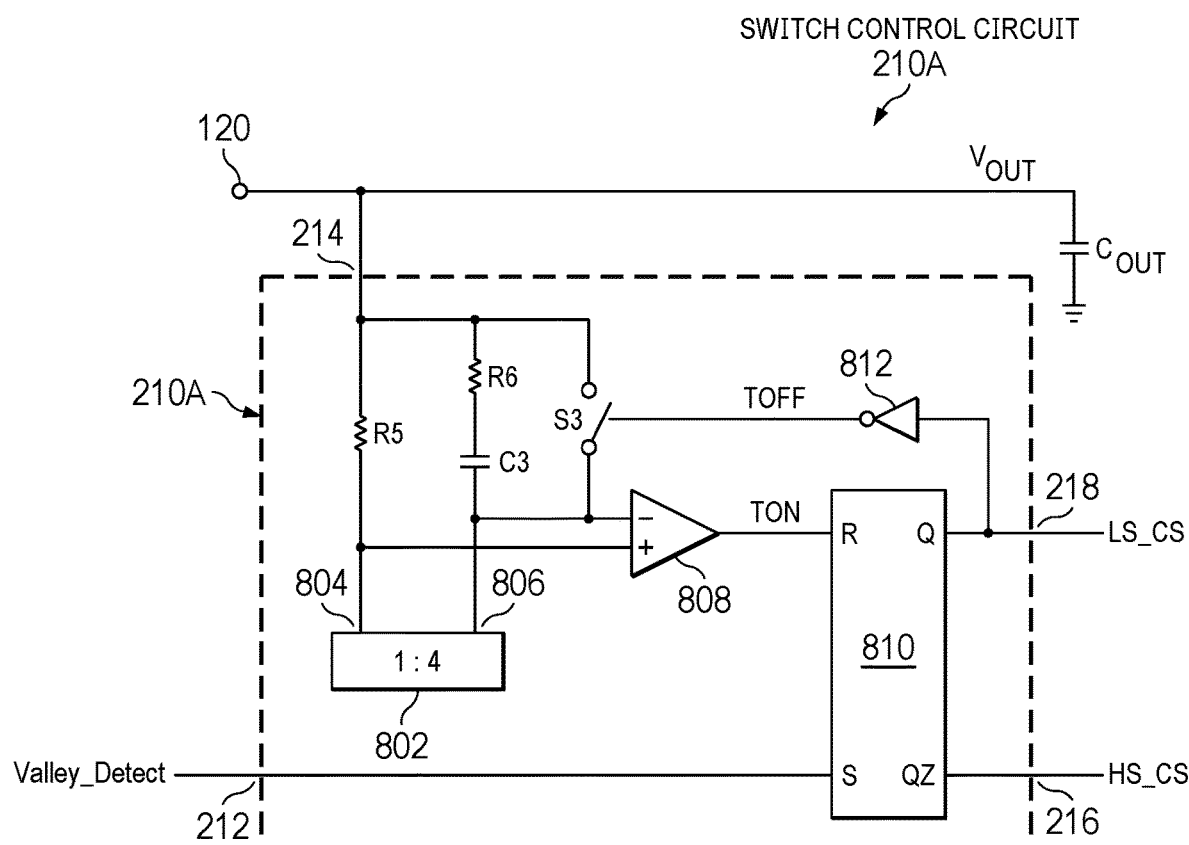
FIG. 8 is a schematic diagram showing a switch control circuit in accordance with an example embodiment.

FIG. 8 is a schematic diagram showing a switch control circuit 210A (an example of the switch control circuit 210 in FIG. 2) in accordance with an example embodiment. In the example of FIG. 8, the switch control circuit 210A includes: current generator 802, resistors (R5 and R6), a capacitor (C3), a switch (S3), a comparator 808, an SR latch 810, and an inverter 812 in the arrangement shown. The current generator 802 has a current generator input 804 and a current generator output 806. Specifically, a first side of R5 is coupled to the sense input 214. In operation, the switch control circuit 210A is configured to receive $V_{OUT}$ at the sense input 214. The second side of R5 is coupled to the current generator input 804 of the current generator 802. In operation, the current generator 802 is configured to generate a current proportional to $V_{OUT}$ (e.g., $V_{OUT}$/R5) and then amplify this current by 4 times (a 1:4 ratio). The amplified current is used to discharge capacitor C3.

As shown, the second side of R5 is also coupled to a non-inverting ("+") input of the comparator 808. A first side of R6 is coupled to the sense input 214. The second side of R6 is coupled to a first side of C3. The second side of C3 is coupled to the current generator output 806 and the inverting ("−") input of the comparator 808. A first side of S3 is coupled to the sense input 214. A second side of S3 is coupled to the inverting ("−") input of the comparator 808. The output of the comparator 808 is coupled to the reset (R) input of the SR latch 810. The set (S) input of the SR latch 810 is coupled to the control input 212. The Q output of the SR latch 810 is coupled to the second control output 218 and provides LS_CS. The Q output of the SR latch 810 is also coupled to an input of the inverter 812. The output of the inverter 812 is provided to a control terminal of S3. The QZ output of the SR latch 810 is coupled to the first control output 216 and provides HS_CS. In operation, the switch control circuit 210A is configured to provide HS_CS and LS_CS responsive to the Valley_Detect signal, $V_{OUT}$, on-time (TON) control options, and off-time (TOFF) control options. In some example embodiments, TON may be determined using a target duty cycle for a known inductor turns ratio and switching frequency. In some example embodiments, TOFF may be based on the voltage-seconds balance of inductor current.

Figure 9:
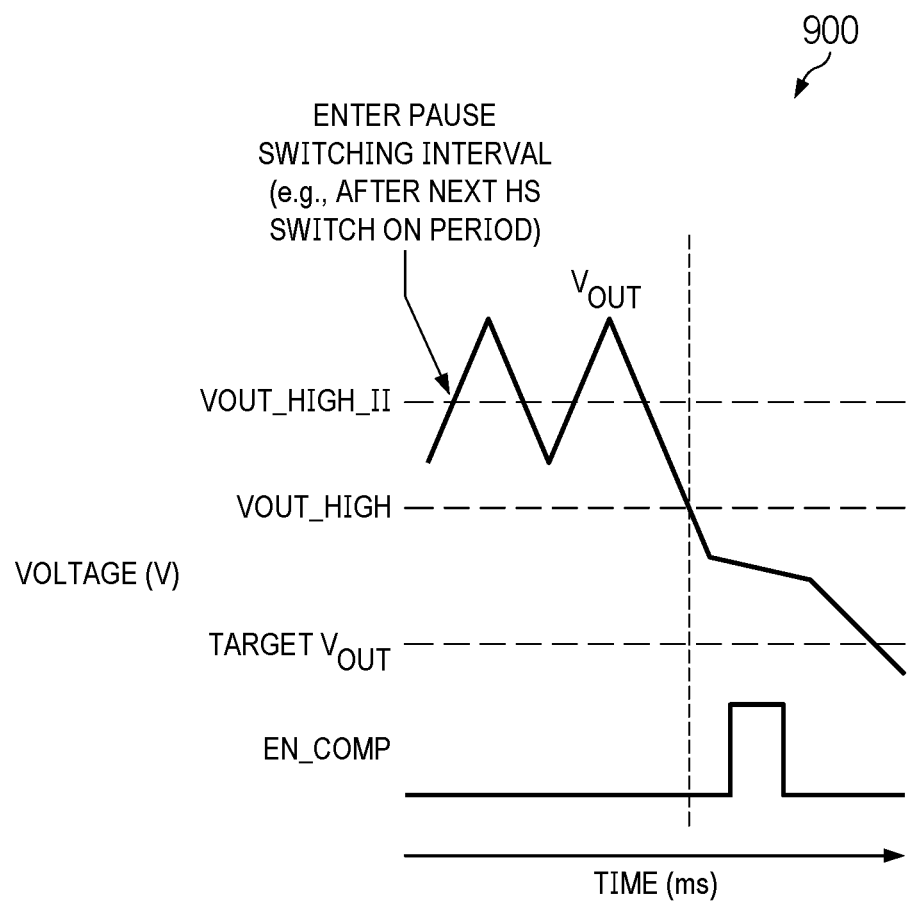
FIGS. 9 and 10 are graphs showing signals related to boost converter controller options in accordance with an example embodiment.
Figure 10:
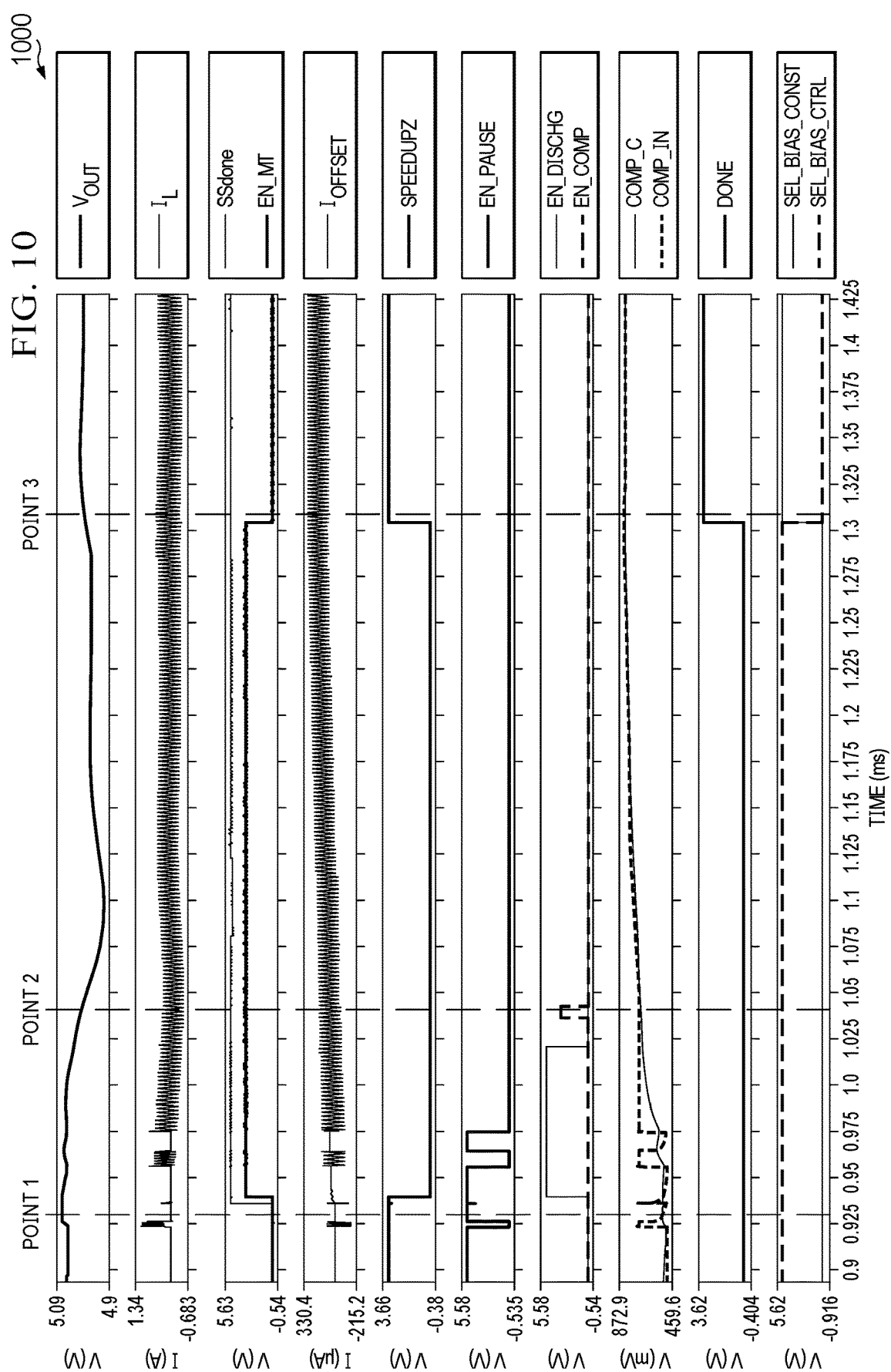

FIGS. 9 and 10 are graphs 900 and 1000 showing signals related to boost converter controller options in accordance with an example embodiment. In graph 900 of FIG. 9, $V_{OUT}$ and EN_COMP signals are shown as a function of time (e.g., during an operating mode transition). Also, example thresholds for $V_{OUT}$_HIGH, $V_{OUT}$_HIGH_II, and the target $V_{OUT}$ are shown. As shown, $V_{OUT}$ has an initial value between the $V_{OUT}$_HIGH and $V_{OUT}$_HIGH_II thresholds. Once $V_{OUT}$ exceeds $V_{OUT}$_HIGH_II, a pause switching interval is initiated (e.g., after a next HS switch on period). The pause switching interval causes $V_{OUT}$ to eventually drop below $V_{OUT}$_HIGH_II, which results in the pause switching interval ending. If there is a light load, $V_{OUT}$ will increase due to the switching operations. In the example of FIG. 9, $V_{OUT}$ exceeds $V_{OUT}$_HIGH_II again, resulting in another pause switching interval being initiated. The pause switching interval causes $V_{OUT}$ to drop below $V_{OUT}$_HIGH_II again. If $V_{OUT}$ drops below VOUT_HIGH (an indication that there will be no more pause switching intervals during the operating mode transition), EN_COMP is asserted. With the assertion of EN_COMP, a compensation charge is applied to Cc of the compensation network (see e.g., FIG. 7). After EN_COMP is de-asserted, the operating mode transition is complete. Even though EN_COMP is de-asserted, the transition continues and $I_{OFFSET}$ ramps up until it reaches target value. The effect of ramping up $I_{OFFSET}$ is like the load increasing. This is because $I_{OFFSET}$ lowers $V_{SW}$ at the time Valley_Detect is asserted (lower $V_{SW}$ is equivalent to pulling a current from $V_{OUT}$).

In the graph 1000 of FIG. 10, $V_{OUT}$, $I_L$, SSdone, EN_MT, $I_{OFFSET}$, SPEEDUPZ, EN_PAUSE, EN_DISCH, EN_COMP, COMP_C, COMP_IN, DONE, SEL_BIAS_CONST, and SEL_BIAS_CTRL signals are shown as a function of time (e.g., during an operating mode transition). At point 1, an operating mode transition is triggered by SSdone, resulting in EN_MT being asserted to initiate the $I_{OFFSET}$ ramp. At the beginning of the operating mode transition, $V_{OUT}$ reaches a pulse-frequency modulation (PFM) threshold (e.g., VOUT_HIGH_II), which results in EN_PAUSE being asserted to initiate a pause switching interval. A discharge operation is enabled using EN_DISCHG to prevent the pause switching interval from lasting too long. Due to the pause switching interval, COMP_C reaches a lower level because the low-clamped value of COMP_IN is selected to save power. At point 2, $V_{OUT}$ returns to a target $V_{OUT}$. In response, one-time compensation is enabled by asserting EN_COMP. At point 3, the DONE signal is triggered and a current mirror of $I_{OFFSET}$ is connected to M14, which biased by constant current. The DONE signal coincides with the end of the operating mode transition. At point 3, $I_L$ is controlled by the controller 140 and SPEEDUPZ is not cleared, which does not affect $I_{OFFSET}$. Before DONE is asserted, M15 is connected to M11. After DONE is asserted, M15 is connected to M14 and SPEEDUPZ only affects M11 (and thus does not need to be cleared after DONE is asserted).

Figure 11:
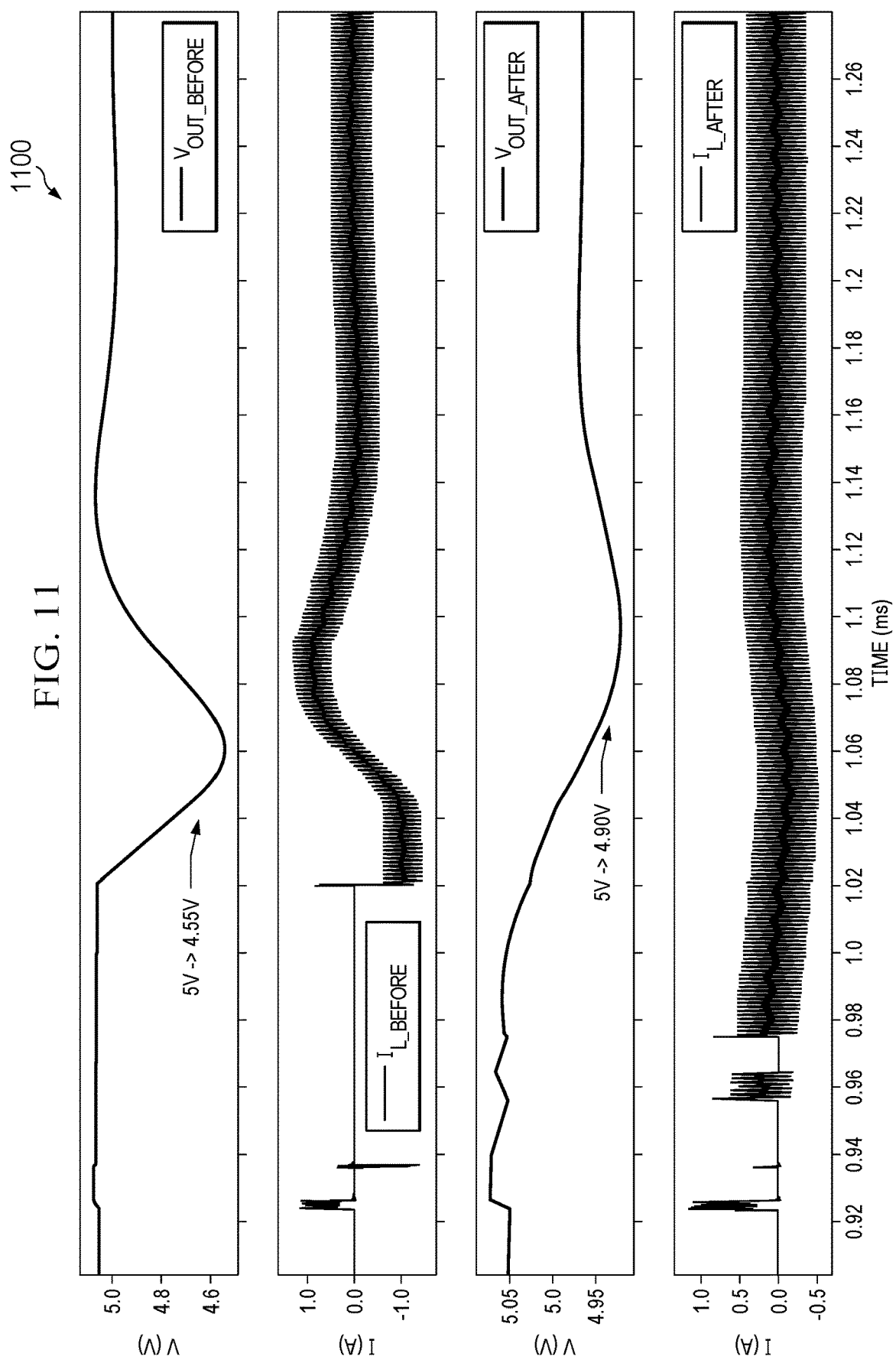
FIG. 11 is a graph showing output voltage and inductor current signals with and without boost converter controller options in accordance with an example embodiment.

FIG. 11 is a graph 1100 showing $V_{OUT}$ and $I_L$ signals with and without boost converter controller options in accordance with an example embodiment. In graph 1100, $V_{OUT\_BEFORE}$, $V_{OUT\_AFTER}$, $I_{L\_BEFORE}$, and $I_{L\_AFTER}$ signals are shown as a function of time (e.g., during an operating mode transition). Without the boost converter controller options described herein, $V_{OUT\_BEFORE}$ drops from 5V to 4.55V, which may be greater than a target $V_{OUT}$ drop. With the boost converter controller options described herein (e.g., the $I_{OFFSET}$ ramp, discharge, one-time compensation and control features), $V_{OUT\_AFTER}$ drops from 5V to 4.90V, which is a much smaller $V_{OUT}$ drop compared to $V_{OUT\_BEFORE}$. $I_{L\_BEFORE}$ and $I_{L\_AFTER}$ show the effect of $I_{OFFSET}$ ramping as described herein. Compared to $I_{L\_BEFORE}$, $I_{L\_AFTER}$ has a smaller inductor current valley envelope. This is due to $I_{OFFSET}$ ramping and results in less $V_{OUT}$ drop.

Figure 12:
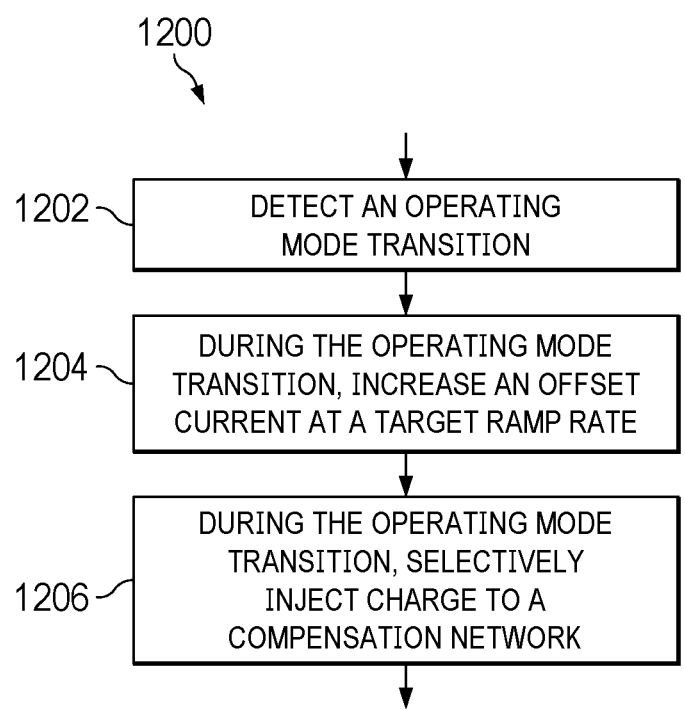
FIG. 12 is a flowchart showing a boost converter controller method in accordance with an example embodiment.

FIG. 12 is a flowchart showing a boost converter controller method 1200 in accordance with an example embodiment. The boost converter controller method 1200 is performed, for example, by a boost converter controller (e.g., controller 140A in FIG. 2) having a valley current sense circuit (e.g., the valley current sense circuit 201 in FIG. 2, or the valley current sense circuit 201A in FIG. 3), an error amplifier (e.g., the error amplifier 250 in FIG. 2, or the error amplifier 250A in FIG. 7), and a compensation network circuit (e.g., the compensation network 255 in FIG. 2, or the compensation network 255A in FIG. 7). As shown, the boost converter controller method 1200 includes detecting an operating mode transition at block 1202. Responsive to detecting operating mode transition at block 1202, $I_{OFFSET}$ is increased at a target ramp rate at block 1204. At block 1206, charge is selectively injected during the operating mode transition to the compensation network. In some example embodiments, charge is injected to the compensation network responsive to a pause switching interval (e.g., a pause switching internal initiated by EN_PAUSE) being initiated at some point during the operation mode transition as well as a condition that indicates there will be no more pause switching interval during the operation mode transition. In some example embodiments, the condition includes $V_{OUT}$ dropping below a threshold (e.g., VOUT_HIGH) between the first threshold (VOUT_HIGH_II) and a target output voltage (TARGET $V_{OUT}$).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A controller, comprising:
   a ramp circuit including:
      ramp generation circuitry having a first control input and a first current output;
      ramp adjustment circuitry having a second control input and a second current output;
      current scaling circuitry having a first current input, a current sense output and an offset current output, the first current input coupled to the first and second current outputs; and
      ramp completion circuitry having a current sense input and a completion output, the current sense input coupled to the current sense output; and
   control logic having a third control input and first and second control outputs, the third control input coupled to the completion output, the first control output coupled to the first control input, and the second control output coupled to the second control input.

2. The controller of claim 1, wherein the control logic has a third control output, and the controller further comprises a charge circuit having an enable input and a charge output, the enable input coupled to the third control output.

3. The controller of claim 2, further comprising an error amplifier and a compensation network, the error amplifier having an error output and first and second amplifier inputs, the compensation network having an error input, a charge input and a reference current control output, the error input coupled to the error output, and the charge input coupled to the charge output.

4. The controller of claim 3, further comprising a valley current sense circuit having a sense circuit input and a sense circuit output, the sense circuit input coupled to the reference current control output.

5. The controller of claim 4, wherein the sense circuit input is a first sense circuit input, and the valley current sense circuit has second, third, and fourth sense circuit inputs.

6. The controller of claim 5, wherein the valley current sense circuit includes the ramp circuit, a voltage-to-current (V2I) converter and a current comparator, the V2I converter having a V2I input and a V2I output, the V2I input coupled to the first sense circuit input, the current comparator having a comparator output and first and second comparator inputs, the first comparator input coupled to the V2I output, the second comparator input coupled to the V2I output and the offset current output, and the comparator output coupled to the sense circuit output.

7. The controller of claim 2, wherein the control logic has a fourth control output, the controller includes a signal generator and first and second inverters, the signal generator has a fourth control input and first and second non-overlapping signal outputs, the fourth control input is coupled to the fourth control output, the first inverter has a first inverter input and a first inverter output, the first inverter input is coupled to the first non-overlapping signal output, the second inverter has a second inverter input and a second inverter output, and the second inverter input is coupled to the second non-overlapping signal output.

8. The controller of claim 7, wherein the ramp circuit has first, second, third, and fourth signal inputs, the first signal input coupled to the second non-overlapping signal output, the second signal input coupled to the second inverter output, the third signal input coupled to the first non-overlapping signal output, and the fourth signal input coupled to the first inverter output.

9. The controller of claim 8, wherein the ramp circuit includes first and second transmission gates, the first transmission gate having fifth and sixth control inputs, the fifth control input coupled to the first signal input, the sixth control input coupled to the second signal input, the second transmission gate having seventh and eighth control inputs, the seventh control input coupled to the third signal input, and the eighth control input coupled to the fourth signal input.

10. The controller of claim 7, wherein the enable input is a first enable input, the control logic has a fifth control output, and the controller further comprises a discharge circuit having a second enable input, a power input and a ground terminal, the second enable input coupled to the fifth control output.

11. A system comprising:
   a power stage having a first power input, a first ground terminal, first and second control inputs, and a power output; and
   a controller having a sense input, a second ground terminal and first and second control outputs, the sense input coupled to the power output, the first control output coupled to the first control input, the second control output coupled to the second control input, the controller including a ramp circuit and control logic,
   the ramp circuit including:
      ramp generation circuitry having a third control input and a first current output;
      ramp adjustment circuitry having a fourth control input and a second current output;
      current scaling circuitry having a first current input, a current sense output and an offset current output, the first current input coupled to the first and second current outputs;
      ramp completion circuitry having a current sense input and a completion output, the current sense input coupled to the current sense output; and
      the control logic having a fifth control input and third and fourth control outputs, the fifth control input coupled to the completion output, the third control output coupled to the third control input, and the fourth control output coupled to the fourth control input.

12. The system of claim 11, wherein the ramp generation circuitry is configured to initiate an offset current ramp responsive to an enable signal received at the third control input, the ramp adjustment circuitry is configured to adjust the rate of the offset current ramp responsive to a speed up signal received at the fourth control input, the ramp completion circuitry is configured to provide a completion signal at the completion output responsive to an offset current at the offset current output reaching a target threshold, and the control logic is configured to: provide the enable signal; provide the speed up signal; and receive the completion signal.

13. The system of claim 12, wherein the control logic is configured to provide the enable signal responsive to an operating mode transition.

14. The system of claim 13, wherein the operating mode transition involves transitioning from a light load discontinuous conduction mode (DCM) to a light load forced continuous conduction mode (FCCM).

15. The system of claim 13, wherein the control logic is configured to provide the speed up signal responsive to a pause switching interval being initiated during the operating mode transition.

16. The system of claim 13, wherein the enable signal is a first enable signal, the controller includes a compensation network and a charge circuit, and the charge circuit is configured to provide charge to a capacitor of the compensation network responsive to a second enable signal provided by the control logic during the operating mode transition.

17. The system of claim 16, wherein the second enable signal is provided responsive to a pause switching signal.

18. The system of claim 17, wherein the pause switching signal is provided responsive to a voltage at the power output being greater than a threshold during the operating mode transition.

19. The system of claim 18, wherein the controller includes a discharge circuit coupled to the power output, the discharge circuit configured to couple the power output to a ground terminal responsive to a condition indicating there will be no more pause switching intervals during the operating mode transition.

20. The system of claim 19, wherein the threshold is a first threshold, and the condition includes the voltage at the power output dropping below a second threshold between the first threshold and a target output voltage.

21. The system of claim 13, wherein the ramp adjustment circuitry is configured to adjust an initial offset current responsive to receiving the speed up signal at the fourth control input.

\* \* \* \* \*